United States Patent [19]
Liou et al.

[11] Patent Number: 5,399,513
[45] Date of Patent: Mar. 21, 1995

[54] SALICIDE COMPATIBLE CMOS PROCESS WITH A DIFFERENTIAL OXIDE IMPLANT MASK

[75] Inventors: Tian-I Liou; Chih-Sieh Teng, both of San Jose, Calif.

[73] Assignee: National Semiconductor Corporation, Santa Clara, Calif.

[21] Appl. No.: 979,562

[22] Filed: Nov. 17, 1992

Related U.S. Application Data

[63] Continuation of Ser. No. 762,644, Sep. 19, 1991, abandoned, which is a continuation of Ser. No. 371,483, Jun. 27, 1989, abandoned.

[51] Int. Cl.⁶ ............................................. H01L 21/336
[52] U.S. Cl. ..................................... 437/34; 437/44; 437/57; 437/200; 437/192
[58] Field of Search .................. 437/27, 28, 29, 30, 437/34, 40, 41, 44, 56, 57, 192, 200; 257/336, 369, 377

[56] References Cited

U.S. PATENT DOCUMENTS

| | | |
|---|---|---|
| 4,314,857 | 2/1982 | Aitken . |
| 4,356,623 | 11/1982 | Hunter . |
| 4,358,890 | 11/1982 | Heller et al. . |
| 4,470,852 | 9/1984 | Ellsworth .................. 437/34 |
| 4,474,624 | 10/1984 | Matthews ................... 437/34 |
| 4,480,375 | 11/1984 | Cottrell et al. ............. 437/34 |
| 4,753,898 | 6/1988 | Parrillo et al. .............. 437/44 |
| 4,771,014 | 9/1988 | Liou et al. .................. 437/34 |
| 4,775,642 | 10/1988 | Chang et al. ................ 437/44 |
| 4,949,136 | 8/1990 | Jain . |
| 4,963,504 | 10/1990 | Huang ...................... 437/233 |
| 5,091,763 | 2/1992 | Sanchez .................... 437/200 |
| 5,219,784 | 6/1993 | Solheim ..................... 437/44 |

FOREIGN PATENT DOCUMENTS 0164449  12/1985  European Pat. Off. .
0216053A3  4/1987  European Pat. Off. .

OTHER PUBLICATIONS

Lai, Fang-shi J., et al., "A Highly Latchup-Immune 1-μm CMOS Technology Fabricated with 1-MeV Ion Implantation and Self-Aligned TiSi₂," *IEEE Transactions on Electron Devices*, vol. ED-33, No. 9, Sep. 1986, pp. 1308-1320 (New York).

Chen, M-L., et al., "A High Performance Submicron CMOS Process with Self-Aligned Chan-Stop and Punch-Through Implants (Twin-Tub V)," *International Electron Devices Meeting Technical Digest*, Dec. 7-10, 1986, pp. 256-259 (Los Angeles).

L. C. Parrillo et al., *Twin-Tub CMOS II—An Advanced VLSI Technology*, IEDM '82, pp. 706-709.

Fair et al., *Modeling Physical Limitations on Junction Scaling of CMOS*, IEEE Trans. on Electron Devices, ED-31, No. 9, Sep. 1984, pp. 1180-1185.

Scott, et al., *Considerations for Scaled CMOS Source/Drains*, Reprint –IEDM '81, pp. 538-541.

R. R. Doering et al., *A High Performance 1 μm CMOS Process for VLSI Applications*, IEEE 1985 Custom Integrated Circuits Conference, pp. 196-198.

A. C. Hui et al, *An Oxide Masked P+ Source/Drain Implant for VLSI CMOS*, IEDM '82, pp. 698-701.

Wolf et al., Silicon Processing for the VLSI Era, vol. 1: Process Technology, Lattice Press, 1986, pp. 397-399.

H. Mikoshiba et al., *Comparison of Drain Structures in n-Channel MOSFETS*, IEEE Trans. on Electron Dev., ED-33, No. 1, Jan. 1986, pp. 140-144.

J. Agraz-Guerena et al., *Twin-Tub III -A Third Generation CMOS Technology*, IEDM '84, pp. 63-66.

L. C. Parrillo et al., *Twin-Tub CMOS —A Technology for VLSI Circuits*, IEDM '80, pp. 752-755.

*Primary Examiner*—Mary Wilczewski
*Attorney, Agent, or Firm*—Limbach & Limbach

[57] ABSTRACT

The present process comprises the use of a differential oxidation of the source/drain regions to permit elimination of the p+ implant mask normally required for formation of p-channel device in a CMOS process. A DDD procedure provides protection against hot-electron effects. A second oxide spacer is included to allow formation of salicide at the contacts to provide low sheet resistance.

10 Claims, 4 Drawing Sheets

SALICIDE COMPATIBLE CMOS PROCESS WITH A DIFFERENTIAL OXIDE IMPLANT MASK

This is a continuation of application Ser. No. 07/762,644, filed on Sep. 19, 1991, now abandoned, which is a FWC of parent application Ser. No. 371,483, filed Jun. 27, 1989, now abandoned.

FIELD OF THE INVENTION

The invention herein relates to the production of CMOS devices. More particularly it relates to a method for production of CMOS devices in which certain masks can be eliminated.

BACKGROUND OF THE INVENTION

A significant limiting factor in current n-channel MOSFETs is hot-electron-induced degradation, because of high channel electric fields and electron impact ionization rates in the micron and sub-micron n-channel devices. In hot electron injection, electrons are injected into the gate oxide by the high electric field created by the short channel region adjacent to the drain. As a result, the threshold voltage of the device is altered. In addition, overlap between the gate electrode and the source and drain results in parasitic capacitance between the diffusion region and the gate. This phenomenon, called Miller capacitance, decreases device speed.

"Lightly doped drain" (LDD) and "double diffused drain" (DDD) structures have been developed to minimize this degradation. Both of these structures are based on the theory that if there is a lightly doped n-surface layer adjacent to the channel, the peak electric field will be reduced and shifted from under the gate so that hot electron-induced degradation will be lessened. However, both pose other types of problems. Production of LDD structures requires the use of an additional mask to prevent LDD phosphorus from implanting into p-channel regions. In both the LDD and DDD structures one must construct a highly doped n+ region to produce low contact resistance at the n-channel source and drain for high-speed circuits.

The production of CMOS (complementary metal-oxide semiconductor) devices requires somewhere in the area of eleven masks to produce the sequential layers of oxides, active areas and contacts which form the device. Each step in the device production generally involves a separate mask, except where "blanket" implant and oxidations can be effected. Each mask which must be used adds to the cost and time required to produce the device. The requirement of added mask steps to reduce hot electron effects has provided greater incentive to find other steps for which masks may be eliminated.

One effort to decrease the number of mask steps involved the use of differential oxidation to eliminate the p+ implant mask. (A. Hui, et al, "An Oxide Masked P+ Source/Drain Implant for VLSI CMOS", IEDM 1982 pp 698.) An n+ implant is performed with a masking step to cover p+ regions with photoresist. Oxide is grown after the photoresist is stripped. Because of the difference in dopant concentrations between the p- and the n- channel source/drain regions, a thicker oxide is grown over the n-channel regions. A p+ implant can be performed which will pass through the thin oxide over the p-channel sources and drains but will be blocked by the thicker oxide over the n-channel sources and drains. This process, however, is not compatible with a self-aligned silicide (salicide) process.

Salicide processes are desirable for their ability to produce low sheet resistance at contacts to polysilicon, n+ and p+ regions for MOS devices in the micron and submicron ranges. Salicides allow increased device speeds where scaling down of contact dimensions would otherwise result in higher contact resistance, causing slower devices. Steps must be taken, however, to provide a clean silicon surface for silicide formation, and to prevent shorts between the gate and the source and/or drain. Such steps are not provided in the prior proposed differential oxide process.

It would therefore be advantageous to be able to combine a procedure which allows for the elimination of a mask step and provides protection against hot-electron effects with a salicide process to provide low resistance contacts and increased device speed. This is a preferred embodiment of the present invention.

SUMMARY OF THE INVENTION

The present process comprises the use of a differential oxidation of the source/drain regions to permit elimination of the p+ implant mask normally required for formation of p-channel device in a CMOS process. A DDD procedure provides protection against hot-electron effects. A second oxide spacer is included to allow formation of salicide at the contacts to provide low sheet resistance.

After completion of a standard CMOS self-aligned gate process through formation of the oxide spacers on the edges of the gate structures, sequential implants of a low energy, high dosage first n-type dopant and a low energy, medium dosage second n-type dopant are performed. A differential thermal oxide is grown, with an accelerated growth rate over the n-channel regions. A p-type dopant is implanted with medium energy and high dosage into p-channel regions. The differential thermal oxide is etched back to silicon, and a set of oxide spacers is formed at the edges of the gate structures. A salicide is formed in the active areas to provide low contact resistance.

BRIEF DESCRIPTION OF THE DRAWING

The single Figure of the drawing is a flow diagram illustrating the sequence of steps in the production process of the present invention.

DETAILED DESCRIPTION AND PREFERRED EMBODIMENTS

Figure 1A:
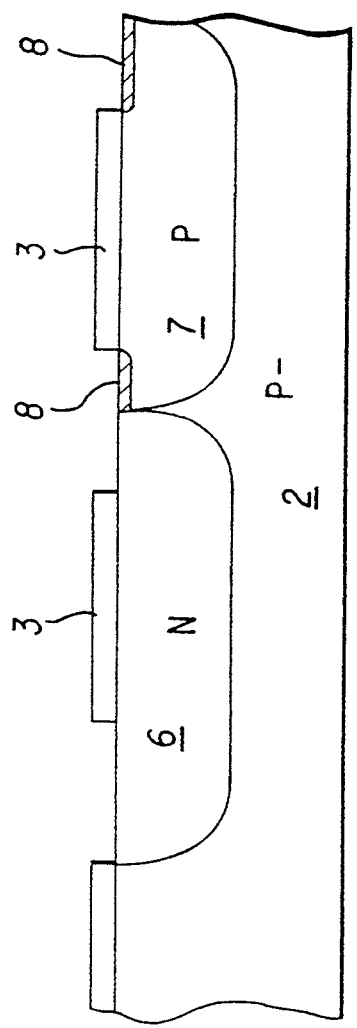
Figure 1B:
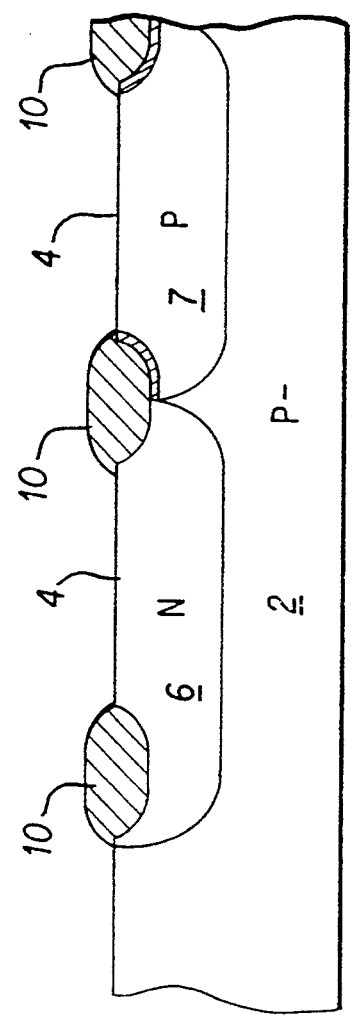
Figure 1C:
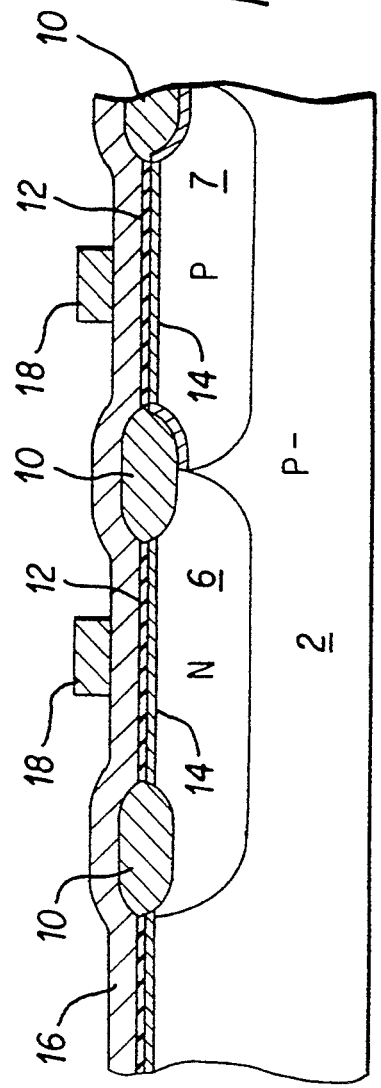
Figure 1D:
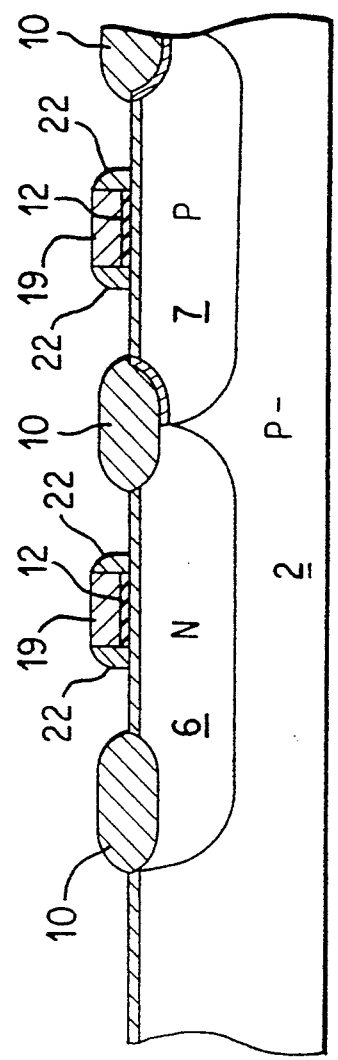
Figure 1E:
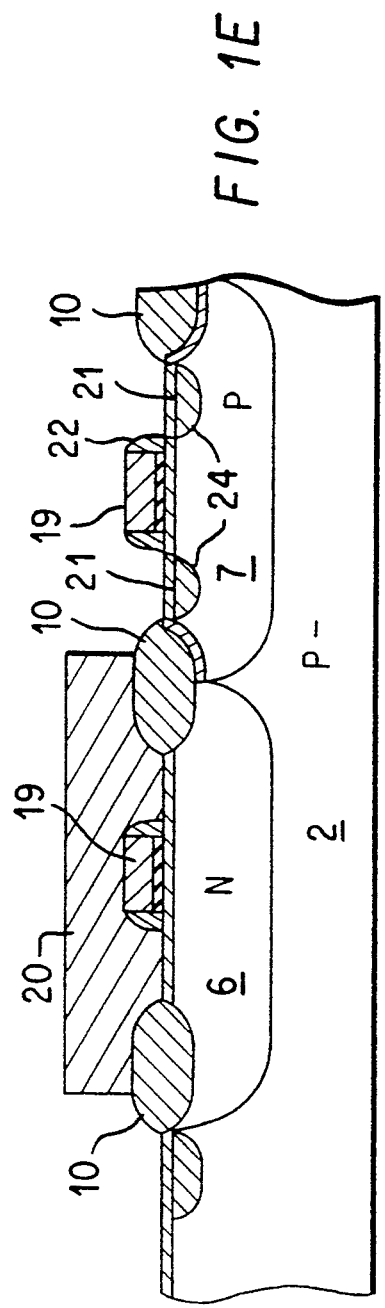
Figure 1F:
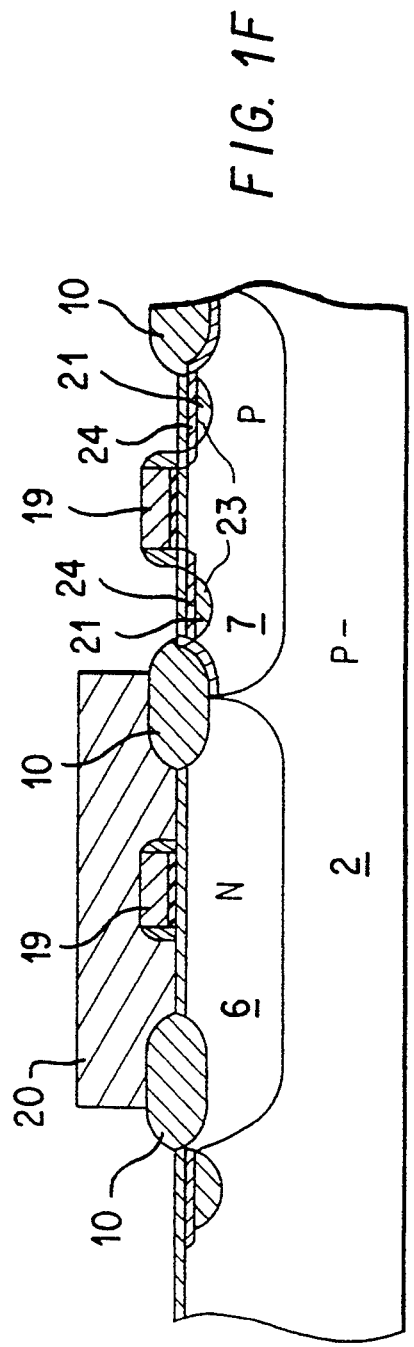
Figure 1G:
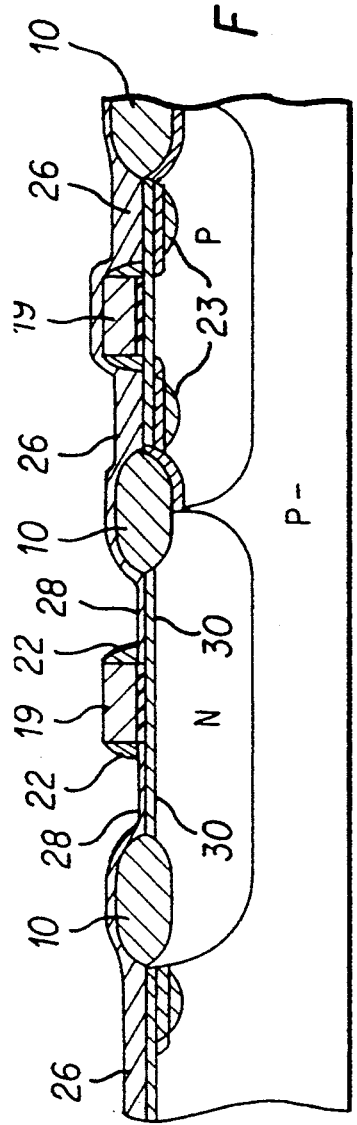
Figure 1H:
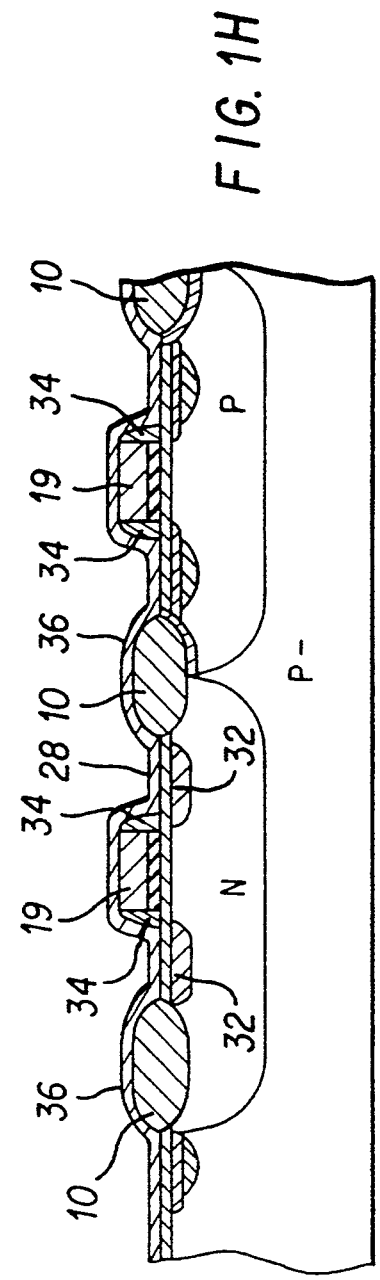
Figure 1J:
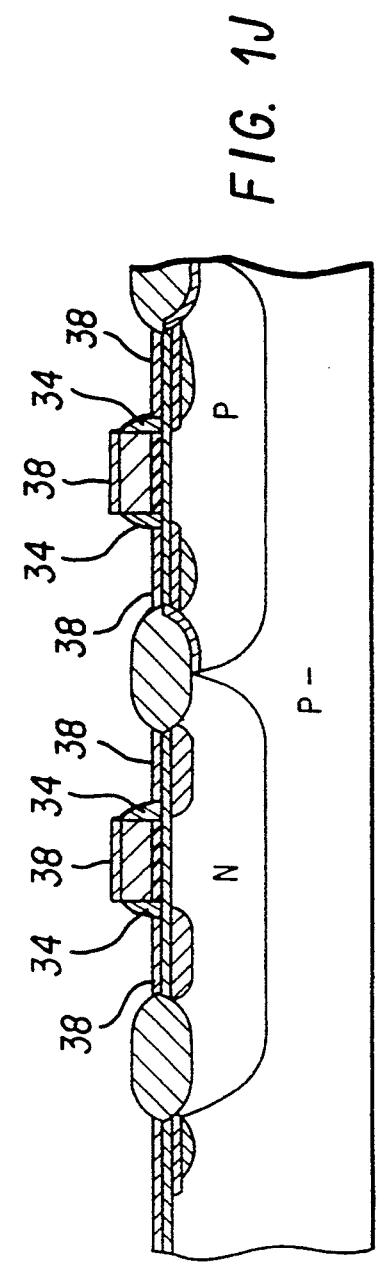
Figure 1K:
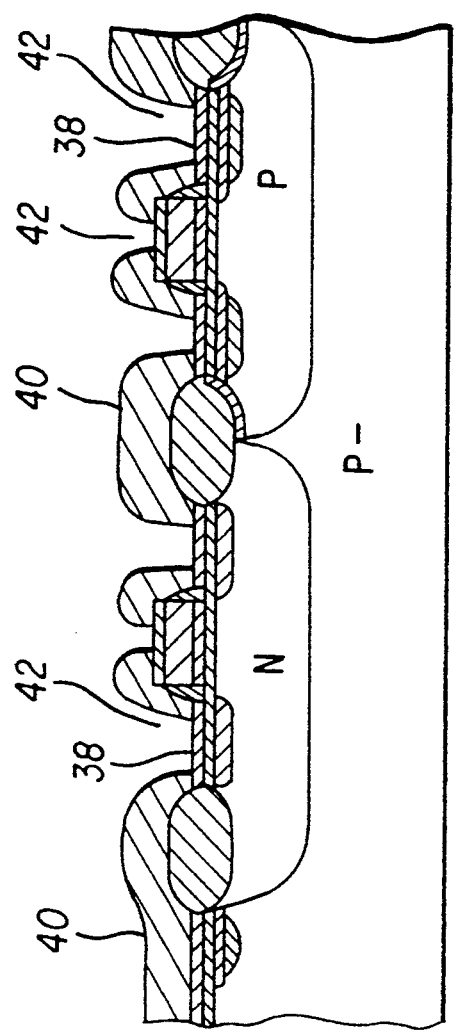
Figure 1L:
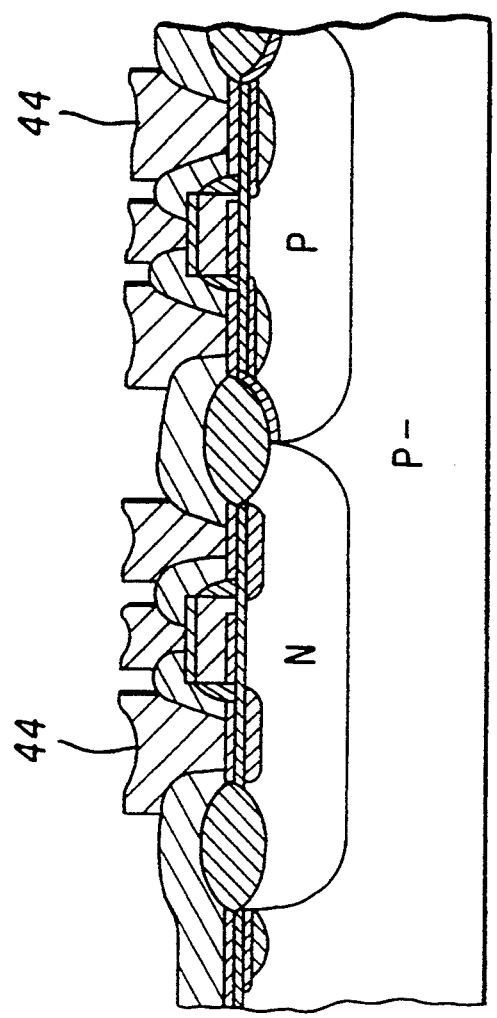

The process of this invention can be best understood by reference to the Figure. The process for fabrication of self-aligned gate MOS devices is well known to those skilled in the art. Therefore, the process steps prior to the description of the present invention will not be detailed, but are merely included to complete the process flow. The proposed process incorporates several novel steps which markedly improve the ease of production while yielding a CMOS device which has operating characteristics equivalent to or better than devices made by conventional processes.

The present process starts with a p-type substrate 2 as illustrated in the Figure. The preferred embodiment uses a twin well process. The n-well 6 is formed by an n− implant into the area exposed by selective removal of a composite layer of thin $SiO_2$ and $Si_3N_4$. A thick oxide is grown in the n− area, after which the $Si_3N_4$ is stripped. A p-well 7 is formed by implant into the area where the Si3N4 was etched away. The n− area is masked against the p− implant by the thicker oxide. All oxides are then stripped and the two wells are driven in.

A first alternate embodiment is the formation of only an n-well in a p-type substrate. The "p-well" in this case would simply be the area which was not exposed during n-implant. A second alternate embodiment would involve starting with a n-type substrate. A p-well would be formed using a similar masking step through which a p-type dopant would be implanted. Both alternate embodiments are widely used in the industry, however, excessive doping effects involved in single-well processes leads to the preference of a twin well process for the present invention.

The active regions 4 are subsequently defined by use of a composite-Si3N4 mask 3, and then are followed by p-field implant 8 using a field implant blocking mask.

Device isolation is achieved by field oxidation 10 of non-active areas through a mask of oxidation-inhibiting silicon nitride, or a composite thereof. Following removal of the silicon nitride, a gate oxide 12 is grown in the active areas, followed by a $V_t$ channel implant 14. Polysilicon 16 is deposited and doped, and is etched as defined by the polysilicon mask 18 to form the gate structures 19. All steps to this point are conventional for CMOS self-aligned gate technology. Slight variations in this procedure may be anticipated and will not impact the scope of the invention.

A low temperature oxide is deposited followed by anisotropic etching to form oxide spacers 22 adjacent to the edges of the gate structures 19. (As an alternative, a thermal oxide may be grown followed by anisotropic etching to form oxide spacers.) Photoresist 20 is spun on the substrate and patterned to expose the n-channel source/drain areas. A dual implant of n-type dopant species is performed to create a double-diffused drain structure in the source/drain regions 24 of the n-channel devices. The first implant 21 is a high dosage, low energy arsenic implant for low contact resistance. The second implant 23 is medium dosage, low energy phosphorous, which diffuses along a shallow area below the surface, forming a lightly doped drain adjacent to the area below gate structure 19. For the purposes of this process, "low" dosage will be defined as doses of $<10^{13}$ atoms/cm$^2$, "medium" dosage as $10^{13}$–$10^{15}$ atoms/cm$^2$ and "high" dosage as $>10^{15}$ atoms/cm$^2$.

A thermal oxidation is performed to grow a differential oxide. The oxide 26 on the n-channel source/drain regions 24 is about 1000Å due to the oxidation-rate enhancement of the n-type dopants. The oxide 28 on the p-channel source/drain 30 grows to only about 400Å. This thinner oxide allows the p+ implant 32 to pass through it into the underlying substrate. In areas where the oxide is thicker, such as the field oxide 10 and oxide 26 over the n-channel source/drain regions 24, the implant is blocked sufficiently to prevent the p-type dopant from entering the substrate.

Thereafter, the structure is subjected to rapid thermal annealing (RTA) to drive in the implants and activate the dopants. Furnace annealing at 900° C. for approximately 80 minutes provides the same degree of dopant activation and counterdoping, however, RTA is preferred in order to minimize diffusion of the junctions.

The differential oxide 26 and 28 is etched back to the underlying substrate. Care must be taken in this step in selection of plasma etch gases and power to avoid damaging the silicon in the p-channel source/drain regions. The etchback will also attack the oxide spacers 22, so it is desirable to provide another step to form spacers for the subsequent salicide steps.

A second deposition of low temperature oxide is performed, followed by anisotropic etching to form oxide spacers 34 adjacent to the edges of the gate structures 19. (The alternative of thermal oxidation to form spacers is not available here, as it is undesirable to subject the source/drain regions to unnecessary high temperature processing to avoid diffusion of the implants.) These spacers serve to prevent shorting from the gate to the source and/or drain as a result of the formation of the salicide.

A thin film of titanium 36 is deposited and the source/drain regions are heat treated to form a salicide 38 of TiSi$_2$. The titanium 36 does not react where it is deposited on oxide, specifically over .field oxide 10 and oxide spacers 34. The unreacted titanium is subsequently removed. The salicide 38 produces low sheet resistance in all contacts.

A low temperature dielectric film 40 is deposited and patterned with photoresist through which contact openings 42 are etched. Interconnect 44 is achieved using conventional procedures of metal deposition and patterning.

By this technique, the need to use LDD and p+ masks is eliminated. The inclusion of a second set of spacers allows the formation of a salicide to improve device speed.

Specific examples derived from experimental results will illustrate the process of this invention. The double diffused source/drain is created by a sequential implant of arsenic and phosphorous. The arsenic implant had a dose of $4 \times 10^{15}$ atoms/cm$^2$ and an energy of 50 KeV. It is contemplated that doses in the range of $2 \times 10^{15}$ to $8 \times 10^{15}$ atoms/cm$^2$ will be suitable for use, with the preferred ranges being $3 \times 10^{15}$ to $6 \times 10^{15}$ atoms/cm$^2$. The phosphorous implant had a dose of $2 \times 10^{14}$ atoms/cm$^2$ and an energy of 50 KeV. Generally the phosphorus implant will be conducted with doses of $9 \times 10^{13}$ to $4 \times 10^{14}$ atoms/cm$^2$ and energies of 40 to 60 KeV. The latter implant provides protection against hot-electron effects by forming a shallow, lightly doped junction adjacent to the device gate. The arsenic implant follows conventional processes, providing a low contact resistance in the n-channel sources and drains.

The differential oxidation was accomplished in an oxidation furnace at 900° C. for 40 minutes in an atmosphere of pure oxygen.

The p+ implant energy must be high enough to allow the dopant to pass through the 400Å differential oxide, but not so high as to enter the regions protected by the 1000Å differential oxide. A BF$_2$ implant of $3 \times 10^{15}$ atoms/cm$^2$ and 70 KeV was used. A suitable range for this implant is $2 \times 10^{15}$ to $5 \times 10^{15}$ atoms/cm$^2$ and 60 to 80 KeV. The device characteristics of a CMOS device made by the process of this invention are given in the Table below, derived from tests of 100/1 μm MOSFET's.

TABLE

|  | n-channel | p-channel |
|---|---|---|
| $V_t$, V | 0.76 | −0.87 |
| M-factor$^a$, $V^{0.5}$ | 0.53 | −0.42 |
| $5 \times 5 I^b$, mA | 27.4 | 16.10 |
| $BV_{dss}$, V | 13.4 | −12.1 |
| $I_{sx}(max)^c$, μA | 49.5 | 0.10 |
| Beta$^d$(4V), μA/V$^2$ | 71 | 20.6 |
|  | Sheet Resistance, | Junction |

TABLE-continued

|  | ohm/square | Depth, μm |
|---|---|---|
| n+ | 3.2 | 0.17 |
| P+ | 3.9 | 0.25 |
| polysilicon, n+ | 6.6 | — |
| n− | 2400 | 1.7 |

Notes:
a. Body effect
b. Saturation current where $V_D = V_G = 5$ V
c. Peak substrate current
d. "Beta-Factor" $= \mu C_{ox}$, where $\mu$ = mobility and $C_{ox}$ = gate oxide capacitance It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. In a method of manufacturing a CMOS device wherein the method includes the sequential steps of providing a semiconductor substrate of p-type conductivity; implanting n-type impurity into selected regions of the semiconductor substrate to define n-type substrate regions and p-type substrate regions; forming field oxide regions in the semiconductor substrate to electrically isolate the n-type and p-type substrate regions to thereby define n-type active device substrate regions and p-type active device substrate regions; forming a layer of gate dielectric material on the substrate surface in both the n-type and the p-type active device substrate regions; forming gate electrodes on the gate dielectric material in both the n-type and the p-type active device substrate regions; forming initial spacer dielectric material directly adjacent to exposed edges of the gate electrodes to define initial insulating sidewall spacers on said exposed edges; performing a low-energy, high-dosage implant of n-type impurity into the p-type active device substrate regions to define n-type source and drain regions of n-channel MOS transistors; performing a low energy, medium-dosage implant of n-type impurity into said n-type source and drain regions; forming a thermal differential oxide on the surface of the n-type and p-type active device substrate region such that said differential oxide grows at a first rate on the surface of said p-type active device substrate regions and at a second rate on the surface of said n-type active device substrate regions, the second rate being slower than the first rate; performing a medium-energy, high-dosage implant of p-type impurity into the n-type active device substrate regions to define p-type source and drain regions of p-channel MOS transistors; the additional steps of:
performing an etchback of said differential oxide to remove said differential oxide, said etchback resulting in the removal of initial sidewall spacer material from said initial insulating sidewall spacers;
forming additional sidewall spacer material to replace removed initial sidewall spacer material, thereby defining final reconstituted insulating sidewall spacers on the edges of the gate electrodes; and
forming a salicide in said n-type and p-type source and drain regions by depositing a metal and exposing said substrate to temperature treatment.

2. A method as in claim 1 wherein said etchback results in the removal of only a portion of the initial spacer material such that initial spacer material remains formed directly on the edges of the gate electrodes and the additional sidewall spacer material is formed adjacent the remaining portion of the initial spacer material.

3. The method as defined in claim 1 wherein said n-type dopant with which said low-energy, high-dosage implant is performed is arsenic, with dosage in the range of $2 \times 10^{15}$ to $8 \times 10^{15}$ atoms/cm$^2$ and energy in the range of 40 to 60 KeV.

4. The method as defined in claim 1 wherein said n-type dopant with which said low energy, medium-do implant is performed is phosphorus, with dosage in the range of $9 \times 10^{13}$ to $4 \times 10^{14}$ atoms/cm$^2$ and energy in the range of 40 to 60 KeV.

5. The method as defined in claim 1 wherein said p-type dopant with which said medium-energy, high-dosage p+ implant is performed is BF$_2$, with dosage in the range of $2 \times 10^{15}$ to $5 \times 10^{15}$ atoms/cm$^2$ and energy in the range of 60 to 80 KeV.

6. The method as defined in claim 1 wherein said metal used to form said salicide is titanium, thereby creating TiSi$_2$.

7. The method as defined in claim 1 wherein rapid thermal annealing is used to repair damage and activate said dopants.

8. The method as defined in claim 1 wherein said final sidewall spacers are formed of oxide and are of sufficient width to prevent gate to source/drain shorts when said salicide is formed.

9. The method as defined in claim 1 wherein said thermal differential oxide is of sufficient thickness over said n-channel regions that it will mask against said p-type implant.

10. The method as defined in claim 1 wherein said thermal differential oxide etchback is adjusted to avoid damage to said p-channel regions.

* * * * *